United States Patent
Murphy et al.

(10) Patent No.: US 6,590,427 B2
(45) Date of Patent: Jul. 8, 2003

(54) PHASE FREQUENCY DETECTOR CIRCUIT HAVING REDUCED DEAD BAND

(75) Inventors: Robert Dale Murphy, Boulder, CO (US); Peter Murray, Louisville, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/946,324

(22) Filed: Sep. 4, 2001

(65) Prior Publication Data

US 2002/0084815 A1 Jul. 4, 2002

Related U.S. Application Data

(60) Provisional application No. 60/259,449, filed on Jan. 3, 2001.

(51) Int. Cl.[7] .......................... G01R 25/00; H03D 13/00
(52) U.S. Cl. ......................................................... 327/12
(58) Field of Search ................................. 327/2, 3, 5, 7, 327/8, 10, 12, 41, 43, 47, 49, 146–148, 150, 155–157, 159, 163

(56) References Cited

U.S. PATENT DOCUMENTS

| | | | | |
|---|---|---|---|---|
| 3,813,604 A | * | 5/1974 | Denoncourt | 327/5 |
| 4,814,726 A | | 3/1989 | Byrd et al. | 331/1 A |
| 5,097,489 A | | 3/1992 | Tucci | 375/120 |
| 5,239,561 A | | 8/1993 | Wong et al. | |
| 5,477,177 A | | 12/1995 | Wong et al. | |
| 5,508,660 A | | 4/1996 | Gersbach et al. | 331/17 |
| 5,592,370 A | | 1/1997 | Rogers | |
| 5,638,410 A | | 6/1997 | Kuddes | |
| 5,727,037 A | | 3/1998 | Maneatis | 375/376 |
| 5,799,051 A | | 8/1998 | Leung et al. | |
| 5,815,016 A | * | 9/1998 | Erickson | 327/158 |
| 5,847,582 A | | 12/1998 | Schrader et al. | |
| 5,870,002 A | | 2/1999 | Ghaderi et al. | |
| 5,896,606 A | | 4/1999 | Huang | |
| 5,933,031 A | * | 8/1999 | Konno | 327/12 |
| 5,939,901 A | | 8/1999 | Geddes | |
| 5,942,924 A | * | 8/1999 | Callahan | 327/142 |
| 5,949,264 A | | 9/1999 | Lo | 327/157 |
| 5,977,801 A | | 11/1999 | Boerstler | 327/7 |
| 6,055,286 A | | 4/2000 | Wu et al. | |
| 6,064,236 A | * | 5/2000 | Kuwata et al. | 327/12 |
| 6,130,565 A | | 10/2000 | Nagano et al. | |
| 6,140,853 A | | 10/2000 | Lo | 327/157 |
| 6,147,530 A | | 11/2000 | Nogawa | |
| 6,154,096 A | | 11/2000 | Chien | |
| 6,249,188 B1 | * | 6/2001 | Kaneko | 327/12 |
| 6,285,219 B1 | * | 9/2001 | Pauls | 327/12 |
| 6,351,154 B2 | * | 2/2002 | Brachmann et al. | 327/12 |
| 6,366,135 B1 | * | 4/2002 | Dalmia et al. | 327/12 |
| 6,538,475 B1 | * | 3/2003 | Johansen et al. | 327/12 |

OTHER PUBLICATIONS

*Phase–Lock Loop Based (PLL) Clock Driver: A Critical Look at Benefits Versus Cost*, Mar. 1997, Texas Instruments Incorporated.

"A Low–Noise, GaAs/AlGaAs, Microwave Frequency–Synthesizer IC," *IEEE Journal of Solid–State Circuits*, vol. 33, No. 9, Sep. 1998.

"Phase–Locked Loop Clock Generators; Application Note AN–155," by Anupama Hegde, Integrated Device Technology, Inc., 1996.

"On Jitter" by Dan Lavry, db Technologies, Inc., Copyright 1997 dB Technologies.

* cited by examiner

*Primary Examiner*—My-Trang Nu Ton
(74) *Attorney, Agent, or Firm*—Merchant & Gould P.C.

(57) ABSTRACT

A digital phase detector that conducts pump up and pump down control signals to a charge pump, wherein each of the control signals has pulses that have a substantially 50/50 duty cycle characteristic when the two input signals, i.e., the input data signal and the feedback clock signal, are substantially in phase. This substantially 50/50 duty cycle output reduces, if not eliminates, inherent problems related to the turn-on delays of the charge pump while maintaining a locked condition. The phase detector may further include an intelligence to detect and handle other situations, such as missing data pulses.

15 Claims, 6 Drawing Sheets

PHASE FREQUENCY DETECTOR CIRCUIT HAVING REDUCED DEAD BAND

RELATED APPLICATIONS

This application claims priority of U.S. provisional application Ser. No. 60/259,449, filed Jan. 3, 2001.

FIELD OF THE INVENTION

This application relates generally to phase lock loop technology and more particularly to a phase detection system for phase lock loop circuits. More particularly still, the present invention relates to a phase detector that reduces dead band.

BACKGROUND OF THE INVENTION

Phase lock loop circuits are prevalently used in many and various technologies. In general, a phase lock loop circuit receives an incoming data signal and analyzes that data signal to generate an output clock signal that is synchronized to the incoming data signal. Creating the synchronized output clock is highly beneficial as this synchronized clock signal can then be used in many different algorithms to further analyze and utilize the incoming data signal in a meaningful manner. For instance, if the incoming data signal must be sampled at a particular point in time in relation to the data signal itself, then it is important to identify the frequency and phase of the incoming data signal to allow for proper sampling of the data signal. Thus, the output clock signal is created with timing characteristics that correspond to the input signal such that the input data signal can be sampled at a meaningful time.

An exemplary phase lock loop system may be a component of a computer disc drive's read channel timing recovery circuit. Phase lock loops are typically used in the disc drive industry to recover the read clock and to generate the write clock at a variety of frequencies depending on which data zones are used.

Phase lock loop circuits typically have a phase detector circuit that receives the data signal and a feedback clock signal. The feedback clock signal is representative, if not identical to the generated output clock signal in terms of phase and frequency. The typical phase detector compares these two input signals, in terms of phase and produces two output control signals "pump up" and "pump down" in response to the comparison. These "pump up" and "pump down" signals are conducted to a charge pump, which, using integration techniques, produces a proportional voltage signal in relation to the received pump up and pump down signals. The voltage signal produced by the charge pump is then conducted to a voltage-controlled oscillator (VCO), which in turn, generates an oscillating voltage clock signal based on the received voltage value. The resulting oscillating signal typically becomes the phase-lock-loop generated clock signal used for future analysis.

A known problem with phase detectors occurs when an input pulse is missing on the data signal. Without added intelligence to handle such a situation, the phase detector, as a result of comparing a pulse with a non-pulse, conducts a signal to the charge pump signifying that the two signals are significantly out of phase, i.e., a pump up or pump down condition. The charge pump reacts to these control signals and remains in a charged state and thus creates an output voltage that may be inappropriate. Prior art solutions to this problem involve using digital logic to test for missing pulses and disable the phase detector during the missing pulse time. Consequently, detecting the missing pulse situation allows the phase detector to modify the signal delivered to the charge pump so that it may "coast" and not substantially impact the output of the VCO during that time frame.

In order to provide a phase detector having integral, missing-pulse-detection logic, the phase detector itself is typically made up of digital logic. Phase detectors that incorporate such digital logic, however, suffer from a unique problem known as "deadband." That is, as the data signal and the feedback clock signal achieve an "in-phase" condition, wherein each signal has essentially the same phase, and thus should be locked, the resulting control signals from the digital phase detector become very small pulses, e.g., approximately five nanosecond pulses. These very small pulses must turn on the analog components of the charge pump to create a proportional voltage, i.e., a voltage proportional to the pulse width. However, when the pulses are so small, the charge pump may not adequately turn on, due to turn on time of the circuit components associated with the charge pump, e.g., three nanosecond turn on time.

When the charge pump fails to turn on, no output control signal is conducted to the VCO, which may react by forcing the clock signal more out of phase. Consequently, typical digital phase lock loop systems continually force the clock signal from being in a phase lock situation to a non-phase lock situation and then back to a phase lock situation. In other words, as the system becomes closer to being in a locked or optimal condition, the smaller the pulses become and therefore prevent the charge pump from turning on which allows the clock to drift out of phase. As the clock drifts out of phase, the pulses become larger and the charge pump turns on to force the clock back in phase, etc. This situation is also known as jitter wherein the clock signal is continuously forced in and out of a phase lock situation.

In order to better understand the present invention, the following brief discussion of a typical prior-art, digital phase detector is provided. FIG. 2 illustrates such a digital phase detector circuit 200, which includes a first flip flop 202 and a second flip flop 204. Flip flop 202 receives a digital data signal 206, while flip flop 204 receives the feedback clock signal 208. The Q outputs of the flip flops 202 and 204 are buffered by buffers 210 and 212, respectively, and conducted to a charge pump (not shown), as pump up signal 214 and pump down signal 216, respectively. The charge pump, to produce a control voltage, evaluates the widths of the resulting signals on 210 and 212.

The "Q" output signals of flip flops 202 and 204 are conducted to NAND gate 218, which conducts a signal to effectively clear the flip flops 202 and 204. Due to inherent delays in the various components, such as 202, 204 and 218 the flip flops 202 and 204 are not cleared immediately following a situation wherein both of the inputs to the NAND gate 218 become high. Consequently, small pulses are still conducted to the charge pump on signals 214 and 216.

FIG. 3 illustrates sample waveforms relating to the prior-art, phase detector 200 shown in FIG. 2. As shown, feedback clock signal 208 and data signal 206 relate to digital pulse signals. Also as shown in FIG. 3, pump down signal 216 conducts a pulse following the rising edge of the feedback clock signal 208. The delay 220 between the rising edges of signals 208 and 216 relates to the time delay in the flip flop 204 and buffer 212. Similarly, the pump up signal 214 conducts a pulse following the rising edge of the data signal 206. The delay 222 between the rising edges of signals 206 and 214 relates to the propagation time delay in the flip flop 202 and buffer 210. The difference in phase may be determined by analyzing the difference in the rising edges of the two signals 206 and 208 or, as shown by determining the delay 224 between the rising edges of the two output signals 214 and 216.

Since the flip flops 202 and 204 are cleared by the NAND gate 218 as soon as the two Q output signals are high, the width of pulse 226 is determined by the delay associated with the NAND gate 218 and delay in clearing the flip flop 202. This width may be extremely short and thus the pulse width may be very small. Importantly, this small pulse may not be high long enough to turn on the components of the charge pump such that the charge pump does not alter its output in response to the small pulse. Moreover, as shown in FIG. 3, as the signals 206 and 208 become more in phase, the width of pulses on 216 become almost as narrow as the pulses on 214. Consequently, the charge pump may not read any signal from the phase detector which prevents any correction from taking place, which condition is known as a dead band, i.e., when the charge pump has no gain. The lack of correction, or dead band, causes the clock signal 208 to become more out of phase. The constant movement in and out of phase is known as jitter.

One common solution to the dead band or jitter problem is to use high-performance or high-speed components in the charge pump. These components have a reduced turn-on time characteristic, which allows the charge pump to more appropriately handle the very slim phase detector pulses. Unfortunately however, these components are expensive. Moreover, since these components still have to be turned on, the slim pulses may still not provide enough time for the components to adequately turn on.

Another solution relates to integrating these high performance components onto the same chip as the phase detector, so as to reduce other delays associated with buffering the output signal of a phase detector chip as the pump control signal is conducted to another chip housing the analog charge pump. Such integration increases cost and significantly reduces the flexibility in designing other components that work in connection with the digital phase detector or the analog charge pump.

It is with respect to these and other considerations that the present invention has been made.

SUMMARY OF THE INVENTION

The present invention relates to a digital phase detector that conducts pump up and pump down control signals to a charge pump, wherein each signal has pulses that have a substantially 50/50 duty cycle characteristic when the two input signals, i.e., the input data signal and the feedback clock signal, are substantially in phase. Thus, the pump up and pump down control signals relate to relatively large, in time, pulses that allow the charge pump time to turn on its components. This substantially 50/50 duty cycle output reduces, if not eliminates, inherent problems related to the turn-on delays of the charge pump while maintaining a locked condition. Furthermore, the digital nature of the phase detector allows for the addition of intelligence to detect and handle other situations, such as missing data pulse situation.

An embodiment of the invention relates to a phase detector for detecting the phase difference between an incoming data signal and a fed-back clock signal. In this embodiment, the phase detector comprises an edge detector for detecting an edge of the data signal and the fed-back clock signal and producing at least one control signal. The control signals are latched by a latch that receives the control signals and latches a plurality of output signals in response to the at least one control signal, wherein the combination of the output signals provides a signal indicative of the difference in the phase between the data signal and the fed-back clock signal. In another embodiment, the combination of the output signals relates to an integration function performed by a charge pump as part of a phase lock loop.

In an embodiment, one of the output signals is held high for approximately half a duty cycle plus an amount of time related to the difference in phase between the data signal and the fed-back clock signal. In this embodiment, the other output signal is similarly held high for approximately half a duty cycle minus an amount of time related to the difference in phase between the data signal and the fed-back clock signal. Hence, the duty cycles for the output control signals approximates a 50/50 duty cycle when the data signal and the fed-back clock signal are substantially in phase, wherein a 50/50 duty cycle relates to each pulse having a width that is substantially equal to half the time between rising edges of each pulse.

In yet another embodiment, the phase detector further incorporates a missing pulse detector. The missing pulse detector may be a flip flop and which effectively disables the phase detector when a missing pulse is detected.

Still another embodiment relates to a method of generating an output clock signal based on an input data signal, wherein the method has acts of detecting a phase difference between the input data signal and a fed-back clock signal and conducting at least two control signals representative of the phase difference to a charge pump wherein the control signals representing the phase difference comprise digital pulse signals having a relatively equal duty cycles when the input data signal and the fed-back clock signal are substantially in phase. The method may further comprise generating a voltage signal in response to the at least two control signals and conducting the voltage signal to a voltage controlled oscillator, which produces an oscillating output clock signal based on the voltage signal received. Additionally, the method act of generating a voltage signal may be performed by a charge pump that integrates the at least two control signals, and wherein the voltage signal is minimal when the input data signal and the fed-back clock signal are substantially in phase. Furthermore, the method may also relate to detecting a missing pulse in the data signal and modifying the at least two control signals in response to detecting the missing pulse to reduce the effect on the charge pump.

These and various other features as well as advantages which characterize the present invention will be apparent from a reading of the following detailed description and a review of the associated drawings.

DETAILED DESCRIPTION

Figure 1:
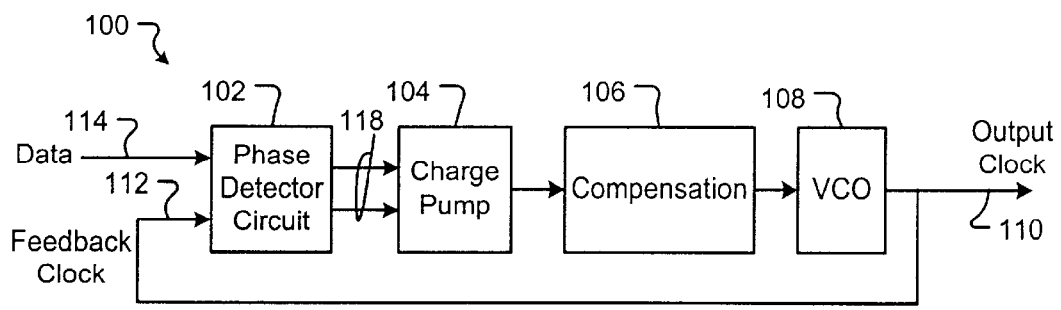
FIG. 1 illustrates a system that may incorporate a phase lock loop system according to the present invention.

A system incorporating the present invention is shown in FIG. 1. The system 100 is a phase lock loop system having a phase detector 102 for detecting the phase of incoming signal and conducting a control signal based on the phase detection, a charge pump 104 for producing a voltage signal based on the received control signal from the phase detector 102, and a voltage-controlled oscillator 108 (VCO) for producing an oscillating signal in relation to the received voltage signal from the charge pump. In an embodiment, the system 100 may also have a compensation circuit 106, such as a filter, amplifier, etc. that may be used to further condition the voltage signal received from the charge pump before conduction to the VCO 108. In other embodiments, additional components may be used in the system 100, such as a divider circuit in the feed back loop.

The system 100 produces a generated output clock signal 110 that has similar characteristics of an input data signal 114. That is, the generated output clock signal 110 is adjusted so that it shares substantially the same phase as the input data signal 114, particularly following some correction time. In order to generate the output clock signal 110, the system 100 conducts a feedback clock signal 112 back to the phase detector 102, which compares the signal 112 to the data signal 114 so that the system 100 can adjust the phase of the output clock signal 110 accordingly.

As stated, the phase detector 102 receives at least two inputs, a data signal 114 and the feedback clock signal 112. Based on a comparison of these two digital signals, the phase detector, which is a digital circuit, provides a pump up and/or a pump down control signal to the charge pump 104. The pump up and pump down signals are signified in FIG. 1 collectively as 108. The control signals 108 relate to voltage pulses that cause the charge pump to either increase its output voltage or to decrease its output voltage. In an embodiment of the invention, when the two signals 112 and 114 are substantially in phase, the two signals 108 each have an increased duty cycle, e.g., substantially 50/50 duty cycle, wherein the length or time duration of each pulse is substantially equal to the time duration between pulses plus or minus an amount representing the phase error between the signals. The substantially 50/50 duty cycle characteristic provides the charge pump enough time to turn on and adjust its output voltage as needed, even when very little change is needed.

Figure 2:
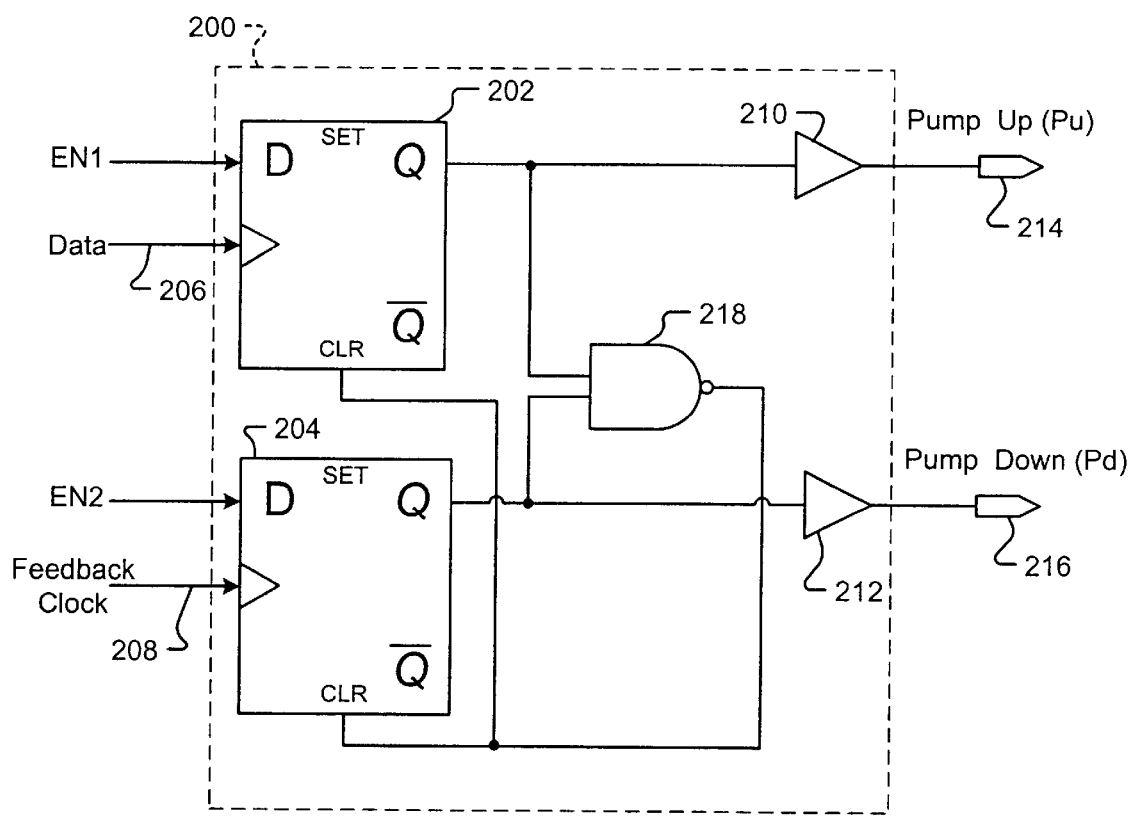
FIG. 2 is a schematic diagram of a prior art digital phase detector circuit.
Figure 3:
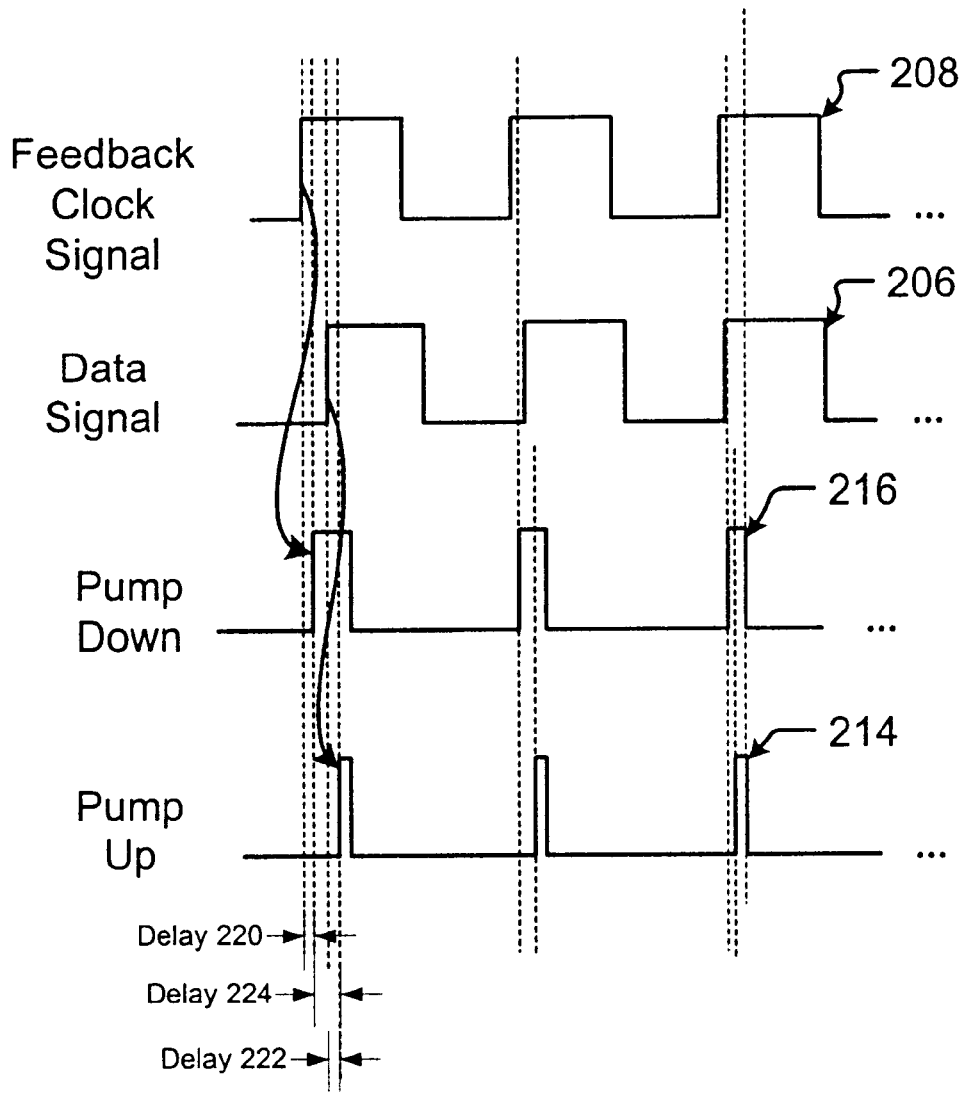
FIG. 3 is a timing diagram of sample waveforms for the prior art digital phase detector circuit shown in FIG. 2.
Figure 4:
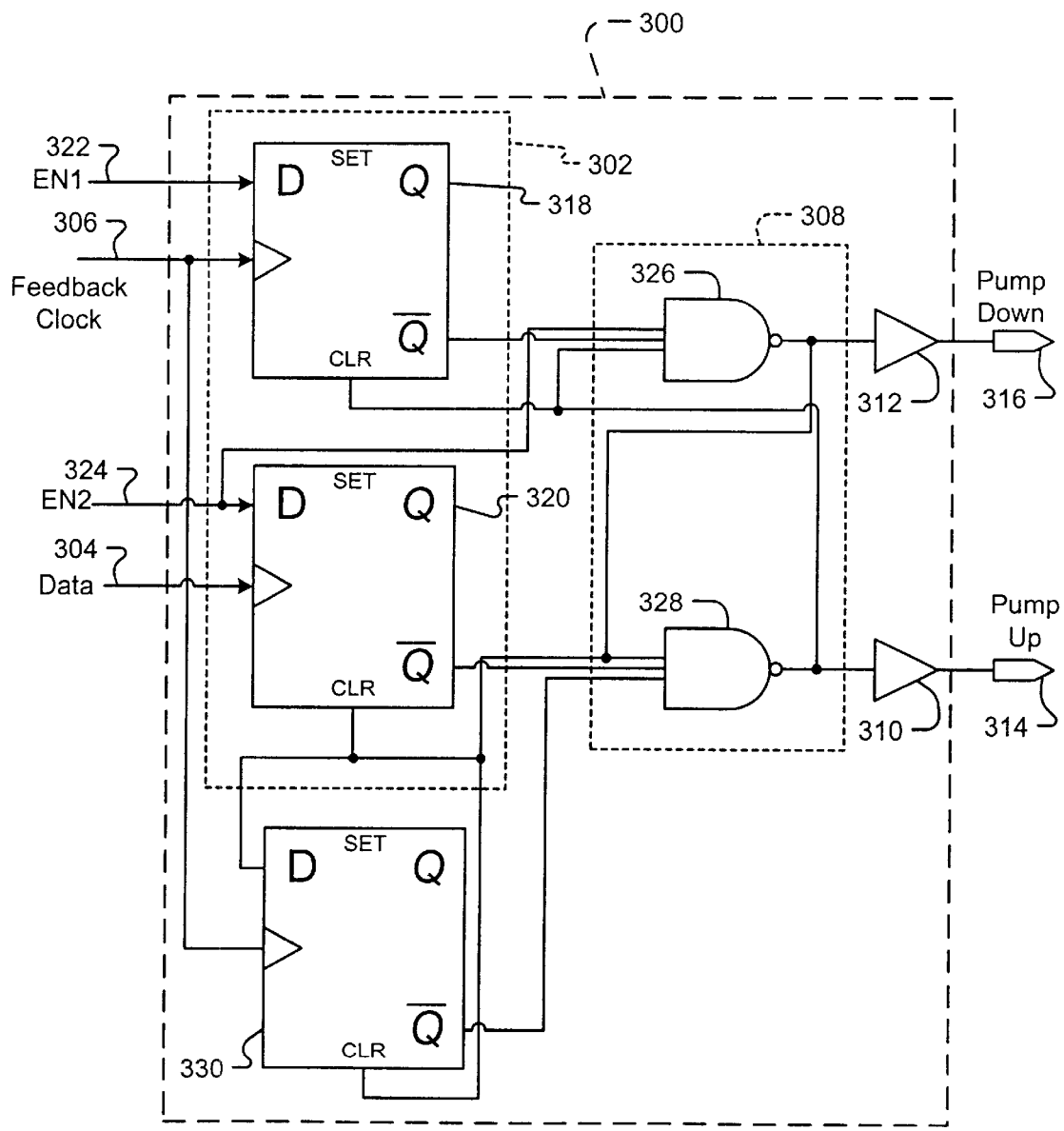
FIG. 4 is a schematic diagram of a digital phase detector circuit according to an embodiment of the present invention.

An embodiment of a digital phase detector 300 incorporating aspects of the present invention and which improves upon the circuit shown in FIG. 2 such that phase detector 300 does not suffer from the problems associated with deadband is shown in FIG. 4. The digital phase detector 300 has a front-end edge detector 302 that latches the incoming rising edges of the data signal 304 and the feedback clock signal 306. Once latched, the front-end edge detector 302 conducts pulses to a Set/Reset latch 308, which receives control signals from the digital front-end edge detector 302 and latches control signals to output buffers 310 and 312. The output buffers 310 and 312 then conduct control signals pump up 314 and pump down 316. Control signals 314 and 316 are the pump up and pump down signals, such as signals 108 that are eventually conducted to a charge pump, such as charge pump 104 (FIG. 1).

With respect to the front-end, edge detector 302, it comprises two flip flops 318 and 320. Flip-flop 318 receives the feedback clock signal 306, which is similar to the feedback clock signal described above. That is, feedback clock signal 306 is derived from the generated output clock signal of the phase detector system, such as system 100 shown in FIG. 1. Flip flop 318 may also receive an enable signal 322, which is tied to the D input when flip flop 318 is a D flip flop. The enable signal 322 is held high during a phase lock loop operation. The enable signal may also be used to disable the phase detector during a missing pulse detection operation, as discussed below.

Flip flop 320 receives an input data signal 304, the data signal 304 representing an input digital data stream such as the data signal 114 shown and described above with respect to FIG. 1. Flip flop 320 may also have an enable signal 324, which conducts a signal to the D input of flip flop 320 when flip flop 320 is a D flip flop. Enable signal 314 is held high during a phase lock loop operation, and may also be used to disable the phase detector for gated operation, wherein gated operation relates to the ability to turn on or off the entire circuit 300.

The flip flops 318 and 320 are used to drive the latch 308. Latch 308 comprises two NAND gates 326 and 328. Given the feedback configuration of the NAND gates 326 and 328, the output buffers 310 and 312 receive similar data pulse signals, each 180 degrees out of phase from the other when the two signals 304 and 306 are in phase. The timing of the pulses is defined or driven by the front-end edge detector 302, such that each output signal 314 and 316 may have a longer pulse width than the other when signals 304 and 306 are out of phase. This difference is used by the charge pump, such as pump 104 (FIG. 1) to generate a control voltage that adjusts the output clock signal of the phase lock loop, such as loop 100 (FIG. 1).

Importantly, during operation, one of the two signals 314 or 316 is high substantially all the time. In other words, as one of the signals 314 or 316 switches from high to low, the other signal switches from low to high, such that one of the two signal is high substantially all the time. Given timing issues of the various components however, the two signals may be held high or low simultaneously for brief time period while the switching signal cycles through the circuit 300.

Since one of the signals 314 and 316 is held high substantially all the time that the phase detector 300 is in operation, the components of the charge pump (such as pump 104 shown in FIG. 1) are turned on substantially all the time. Having the components turned on substantially all the time significantly reduces dependency of the turn on time for the charge pump. When the two signals 304 and 306 are substantially in phase, the pulse width of each of the two signals 314 and 316 is approximately the same as the time between pulses, e.g., a 50/50 duty cycle, such that the charge pump, is charging half the time and discharging the other half. The output signal of the charge pump may then be filtered to a steady state or constant voltage, thereby locking the voltage for the VCO, such as VCO 108 (FIG. 1). Small differences in pulse width of the signals cause an adjustment in the filtered voltage and thus are not lost in turn-on delays.

The phase detector 300 further comprises a missing pulse detector 330. The missing pulse detector 330 determines whether a pulse is missing from the data signal clock signal, and disables the phase detector accordingly. In order to perform this function, flip flop 330 is clocked by the feedback clock signal 306 and then the flip flop 330 makes a decision based on the latched output signal from NAND gate 326. Based on this decision, i.e., whether a pulse is missing, the Q' output of the gate 330 may be used to set or reset the latch 308 through its connection to NAND gate 328. Controlling the latch 308 in this manner reduces the negative impact on the output control signals 314 and 316 due to the missing pulse.

Figure 5:
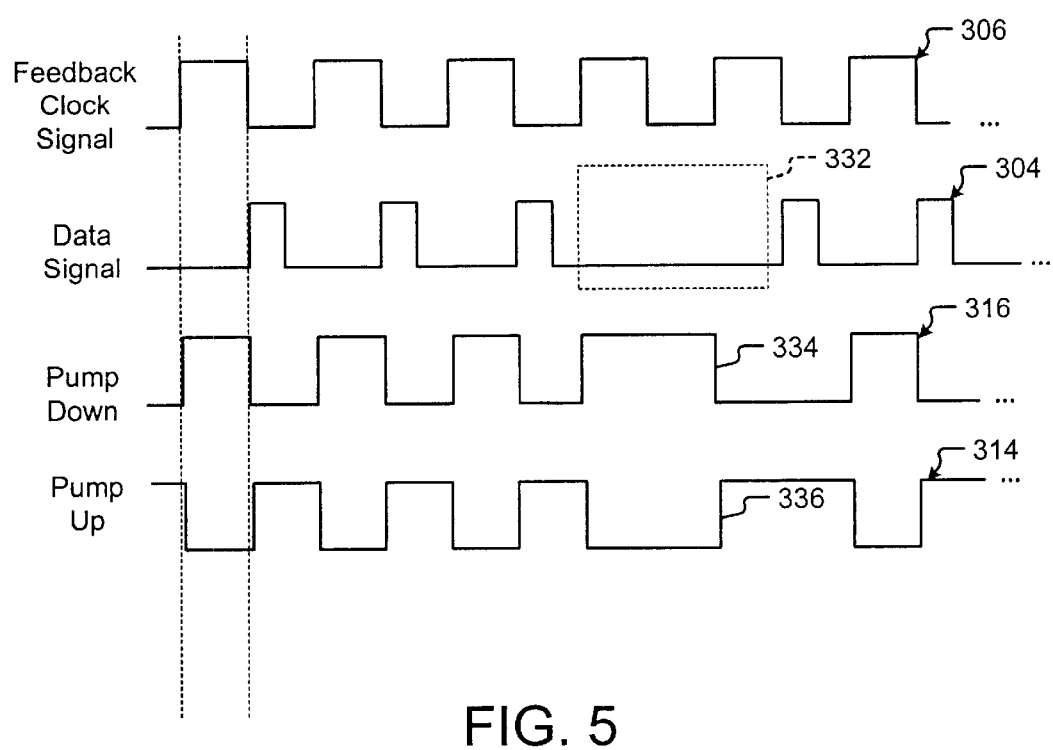
FIG. 5 is a timing diagram of sample waveforms for the embodiment displayed in FIG. 4.

FIG. 5 illustrates sample waveforms relating to the phase detector 300 shown in FIG. 4. As shown, feedback clock signal 306 and data signal 304 relate to digital pulse signals. Also as shown, the clock signal 306 is forced to have a corresponding phase relationship based on the data signal 304. In this embodiment, the clock signal 306, however, is 180 degrees out of phase as compared to the data signal 304. Although out of phase, such a relationship provides the proper characteristics such that the output clock signal, such as signal 110 (FIG. 1) may be used to further sample or evaluate the data signal 304.

FIG. 5 also demonstrates the resulting pump up and pump down signals 314 and 316, respectively, during operation as the two input signals 304 and 306 are substantially locked in a corresponding phase relationship. As shown, the signals 314 and 316 are substantially 180 degrees out of phase compared to the other, and each has an approximate 50/50 duty cycle. The charge pump, e.g., charge pump 104 (FIG. 1) then integrates the signals 314 and 316 and produces a locked voltage for the VCO. Again, the phase detector is virtually insensitive to the effects of propagation delays and buffer delays relative to dead band performance since the charge pump is on most of the time. As shown in FIG. 5, one signal, such as 314 or 316 is high for approximately half the duty cycle plus an amount of time related to the phase difference of the two signals 304 and 306. Furthermore, the other signal 316 or 314 respectively is held high for approximately half the duty cycle minus an amount of time related to the phase difference. The net integration of the two signals provides a signal relative to the phase difference between the signals 304 and 306.

FIG. 5 also illustrates the operational effect of the missing pulse detector 330 (FIG. 4). In essence, the data signal 304 may miss a pulse, such as in the area 332. As the clock signal 306 enables the detector 330, it determines whether the pulse is missing by testing the output latch 308. If a pulse is missing, as indicated by a time-out determination or some other method, the detector 330 conducts a control signal to the latch 308, which causes pump down signal 316 to switch or go low at 334. Additionally, this switch, in turn, causes the pump up signal 314 to also switch or go high at 336, as shown in FIG. 5. Upon identifying that a pulse is missing the two signals 314 and 316 are integrated, which prevents either the pump up or pump down signal to remain high for a disproportional amount of time with respect to the other signal. The effect of integrating these complimentary pump up and pump down pulses result in a substantially zero net charge on the charge pump, thus reducing the potentially negative effects of the missing pulse 332. Stated another way, upon identifying a missing pulse, the pump down signal that was incorrectly held high is cancelled out by the subsequent pump up signal.

Figure 6:
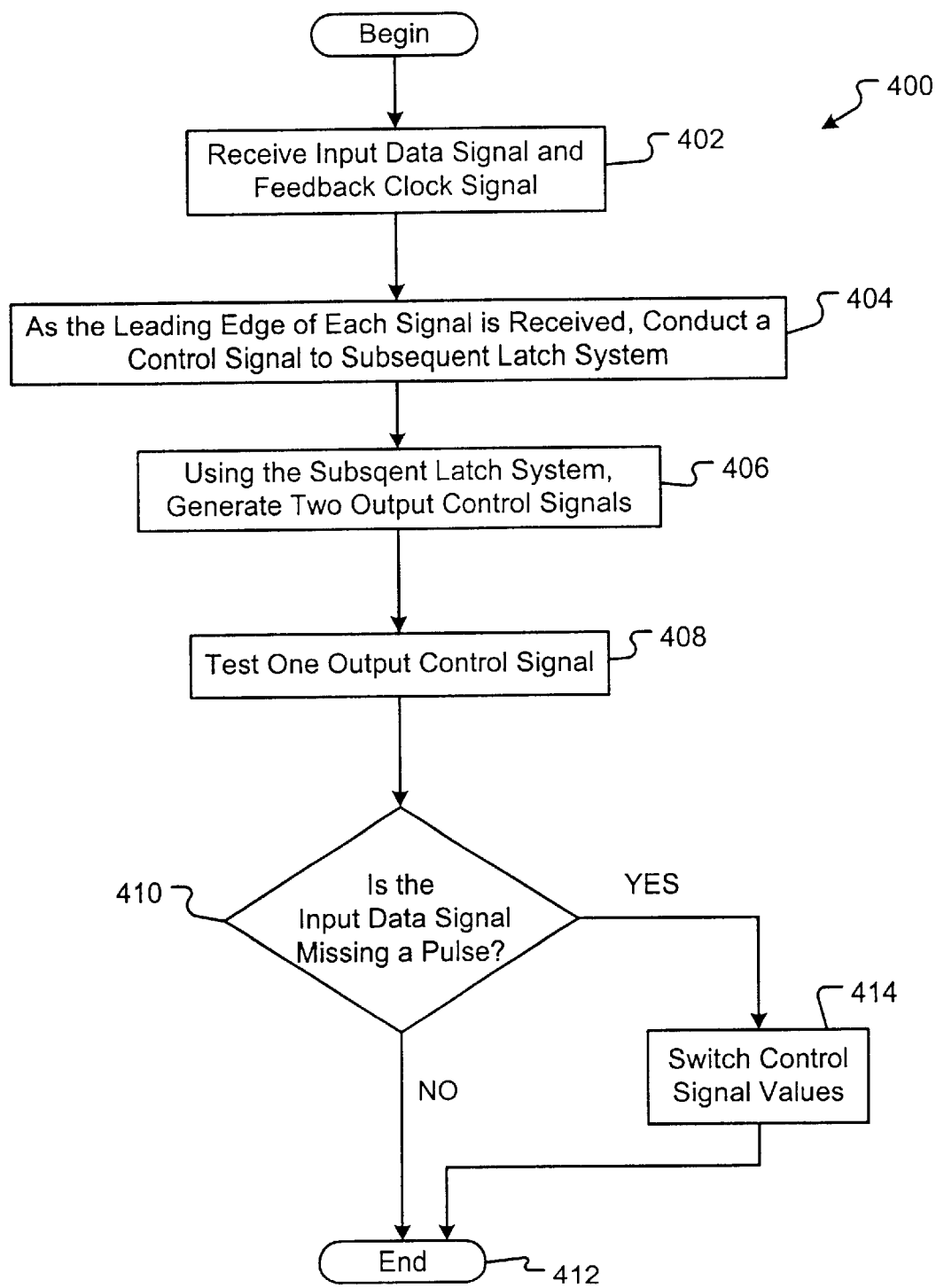
FIG. 6 is a flow chart illustrating functional components of an embodiment of the present invention.

FIG. 6 illustrates the operational flow characteristics of an embodiment of the present invention. Initially, the process 400 begins as receive operation receives both an input data signal and a feedback clock signal. Each of these signals are digital pulse signals have a particular phase characteristic. Upon receiving these signals, conduct operation 404 conducts control signals to a subsequent latch system.

Using the subsequent latch system, latch operation 406 generates two output control signals based on the received control signal conducted by operation 404. The two output controls signals are substantially 180 degrees out of phase from each other and have substantially 50/50 duty cycles. These control signals relate to the pump up and pump down control signals that are eventually conducted to a charge pump to generate an output clock signal.

In accordance with an embodiment, flow 400 also tests at least one of these output control signals at operation 408. Further, determination operation 410 determines whether there is a missing pulse on that input data signal, based on test operation 408. If there is no missing pulse, then flow ends at end operation 412. However, if there is a missing pulse, then flow branches YES to switch operation 414, which switch the states of the two control signals. Switching these states reduces the impact of the missing pulse on the output clock generated through the phase detector system.

The benefits of the above-described invention relate to a phase detector circuit that has a zero dead band at the operating point when the data signal and the clock signal are substantially in phase. Given the reduced impact of delay in the charge pump, the present invention does not need to be integrated onto the same chip as the charge pump, and the charge pump does not have to use the high performance components as with prior art phase detectors. As such, the present invention may be viewed as a phase detection system and method that detects the phase difference between an incoming data signal (such as 304) and a fed-back clock signal (such as 306). The phase detector (such as 300) has an edge detector (such as 302) for detecting an edge of the data signal (such as 304) and the fed-back clock signal (such as 306) and a latch (such as 308) for latching a plurality of output signals (such as 314 and 316), wherein the output signals (such as 314 and 316) have an increased duty cycle when the data signal and the fed-back clock signal are substantially in phase. In another embodiment, the output signals (such as 314 and 316) may be combined to indicate the difference in the phase between the data signal and the fed-back clock signal.

Numerous other changes may be made which will readily suggest themselves to those skilled in the art, e.g., modifying the circuit to test and compensate for missing clock pulses instead of, or in addition to, missing data pulses, and which are encompassed in the spirit of the invention disclosed and as defined in the appended claims.

What is claimed is:

1. A phase detector for detecting a phase difference between an incoming data signal and a fed-back clock signal and for generating a plurality output signals to a charge pump to control the charge pump, the phase detector comprising:
   an edge detector for detecting an edge of the data signal and the fed-back clock signal and producing at least one control signal; and
   a latch that receives the at least one control signal and generates the plurality of output signals responsive to the at least one control signal, wherein a combination of the output signals is indicative of the phase difference between the data signal and the fed-back clock signal, and wherein the output signals have substantially equal duty cycles when the data signal and the fed-back clock signal are substantially in phase.

2. A phase detector as defined in claim 1 wherein the combination of the output signals is an integration function performed by a charge pump.

3. A phase detector as defined in claim 1 wherein a first one of the output signals is high for approximately half a duty cycle plus an amount of time related to the difference in phase between the data signal and the fed-back clock signal, and a second one of the output signals is high for approximately half a duty cycle minus an amount of time related to the difference in phase between the data signal and the fed-back clock signal.

4. A phase detector as defined in claim 3 wherein duty cycles for the output control signals approximates a 50/50 duty cycle when the data signal and the fed-back clock signal are substantially in phase, wherein a 50/50 duty cycle relates to each pulse having a width that is substantially equal to half the time between rising edges of each pulse.

5. A phase detector as defined in claim 1 wherein the phase detector further comprises a missing pulse detector.

6. A phase detector as defined in claim 5 wherein the edge detector comprises a plurality of flip flops and wherein the latch comprises at least two NAND gates configured to form a set/reset latch.

7. A phase detector as defined in claim 5 wherein the missing pulse detector comprises a flip flop and which effectively disables the phase detector when a missing pulse is detected.

8. A phase detector as defined in claim 5 used in combination with a voltage controlled oscillator to generate a phase lock loop system.

9. A method of generating an output clock signal based on an input data signal, the method comprising:
   a) detecting a phase difference between the input data signal and a fed-back clock signal;
   b) conducting at least two control signals representative of the phase difference to a charge pump, wherein the control signals are digital pulse signals having substantially equal duty cycles when the input data signal and the fed-back clock signal are substantially in phase;
   c) generating a voltage signal in response to the at least two control signals; and
   d) conducting the voltage signal to a voltage-controlled oscillator, which produces an oscillating output clock signal based on the voltage signal received.

10. A method as defined in claim 9 wherein the act of generating a voltage signal (c) is performed by the charge pump that integrates the at least two control signals, and wherein the voltage signal is minimal when the input data signal and the fed-back clock signal are substantially in phase.

11. A method as defined in claim 10 further comprising:
   e) detecting a missing pulse in the data signal; and
   f) modifying the at least two control signals in response to detecting the missing pulse to reduce the effect on the charge pump.

12. A method as define in claim 11 wherein the act of modifying the at least two control signals (f) further comprises reversing the values of the at least two control signals upon detecting the missing pulse.

13. A phase lock loop for generating an output clock signal having substantially the same phase as an input data signal, the phase lock loop having a charge pump and a voltage controlled oscillator, the phase lock loop comprising:
   a digital phase detector for detecting the phase difference between the input data signal and a fed-back clock signal; and
   means for conducting two control signals to the charge pump in response to detecting the phase difference, wherein the two control signals have substantially equal duty cycles when the input data signal and the fed-back clock signal are substantially in phase.

14. A phase lock loop for generating an output clock as defined in claim 13 wherein the system further comprises means for detecting a missing pulse.

15. A phase lock loop system as defined in claim 13 wherein the duty cycles of the control signals are approximate a 50/50 duty cycle when the input data signal and the fed-back clock signal are substantially in phase.

* * * * *